United States Patent
Phelan et al.

(10) Patent No.: US 12,247,317 B2
(45) Date of Patent: Mar. 11, 2025

(54) FUNCTIONAL METAL OXIDES AND METHODS OF MAKING SAME

(71) Applicant: THE JOHNS HOPKINS UNIVERSITY, Baltimore, MD (US)

(72) Inventors: William A. Phelan, Baltimore, MD (US); Tanya Berry, Baltimore, MD (US); Mekhola Sinha, Baltimore, MD (US); Tyrel Matthew McQueen, Baltimore, MD (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 0 days.

(21) Appl. No.: 17/639,805

(22) PCT Filed: Sep. 4, 2020

(86) PCT No.: PCT/US2020/049490
§ 371 (c)(1),
(2) Date: Mar. 2, 2022

(87) PCT Pub. No.: WO2021/046410
PCT Pub. Date: Mar. 11, 2021

(65) Prior Publication Data
US 2022/0325439 A1 Oct. 13, 2022

Related U.S. Application Data

(60) Provisional application No. 62/895,854, filed on Sep. 4, 2019.

(51) Int. Cl.
*C30B 13/16* (2006.01)
*C30B 29/30* (2006.01)
*H01J 1/144* (2006.01)

(52) U.S. Cl.
CPC .............. *C30B 29/30* (2013.01); *C30B 13/16* (2013.01); *H01J 1/144* (2013.01); *H01J 2201/2817* (2013.01)

(58) Field of Classification Search
CPC .......... C30B 29/30; C30B 13/16; H01J 1/144; H01J 2201/1816
See application file for complete search history.

(56) References Cited

U.S. PATENT DOCUMENTS

| 5,386,797 A | 2/1995 | Yokota |
| 6,040,070 A | 3/2000 | Szot et al. |

(Continued)

FOREIGN PATENT DOCUMENTS

| CN | 102851028 A | 1/2013 |
| CN | 102925148 A | 9/2014 |

(Continued)

OTHER PUBLICATIONS

Cold Isotatic Pressing Open Learn Open learn University, Dec. 2017.*

(Continued)

*Primary Examiner* — Robert M Kunemund
(74) *Attorney, Agent, or Firm* — MH2 Technology Law Group LLP

(57) ABSTRACT

Metal oxides and method for forming the method oxides are provided. The disclosed functional metal oxides are single crystalline or polycrystalline metal oxides, such as, for example, $SrVO_3$, and have dimensions, phase purity, and crystalline quality previously unachievable. The disclosed methods include a combination of a gas atmosphere, vacuum sintering, and laser-based directional solidification of a seed rod in contact with a feed rod that is scalable for production quantities.

16 Claims, 6 Drawing Sheets

(56) References Cited

U.S. PATENT DOCUMENTS

| | | | |
|---|---|---|---|
| 8,932,699 | B2 | 1/2015 | Ogimoto |
| 2012/0290831 | A1 | 11/2012 | Magis |
| 2012/0298031 | A1 | 11/2012 | Ito et al. |
| 2019/0169499 | A1* | 6/2019 | Cohen ............... C09K 11/7774 |
| 2019/0237265 | A1 | 8/2019 | Radetinac et al. |

FOREIGN PATENT DOCUMENTS

| | | | |
|---|---|---|---|
| EP | 238142 | * | 9/1987 |
| EP | 1060300 B1 | | 9/2002 |
| JP | 2005/154209 | * | 6/2005 |
| JP | 5181396 B2 | | 4/2013 |

OTHER PUBLICATIONS

Nickitas-Etienne, Athina (IB Authorized Officer), International Preliminary Report on Patentability in corresponding International Application No. PCT/US2020/049490 mailed on Mar. 17, 2022, 7 pages.

Zhong et al., Tuning the work function in transition metal oxides and their heterostructures., Physical Review B., (2016), vol. 93:235116.

Ardila et al., Preparation, microstructural and electrical characterization of SrVO3 single crystal fiber., Journal of Crystal Growth., (2000), pp. 313-317, vol. 221(1-4).

Jacobs et al., Understanding and Controlling the Work Function of Perovskite Oxides Using Density Functional Theory., Advanced Functional Materials., (2016), pp. 5471-5482, vol. 26(30).

Boileau et al., Optical and electrical properties of the transparent conductor SrVO3 without long-range crystalline order., Applied Physics Letters., (2018), vol. 112:021905.

Brahlek et al., Accessing a growth window for SrVO3 thin films., Applied Physics Letters., (2015), vol. 107:143108.

Trucchi et al., Electron-emission materials: Advances, applications, and models., MRS Bulletin., (2017), pp. 488-492, vol. 42.

Zhang et al., An ultrabright and monochromatic electron point source made of a LaB6 nanowire., Nature Nanotechnology., (2016), pp. 273-279, vol. 11.

Kishkovich, O. (Ru Authorized Officer), International Search Report and Written Opinion issued Nov. 26, 2020 in corresponding International Application No. PCT/US2020/049490, 9 pages.

* cited by examiner

FUNCTIONAL METAL OXIDES AND METHODS OF MAKING SAME

CROSS REFERENCE TO RELATED APPLICATIONS

This application is a national stage entry from International Application No. PCT/US2020/049049, filed on Sep. 4, 2020, published as International Publication No. WO 2021/046410 A1 on Mar. 11, 2021, and claims the benefit of U.S. Provisional Patent Application No. 62/895,854, filed Sep. 4, 2019, the contents of all of which are hereby incorporated by reference in its entirety.

STATEMENT REGARDING FEDERALLY SPONSORED RESEARCH

This invention was made with government support under contract no. DMR-1539918 awarded by the National Science Foundation. The government has certain rights in the invention.

BACKGROUND OF THE DISCLOSURE

Thermionic emitting materials are capable of generating electron beams, and thus have technologic applications that include microwave generation and electron imaging. These materials are characterized by their work functions, the energy/work required to remove an electron from a material's surface to a vacuum, where typically a lower work function increases the efficiency of the emitter. Recently, strontium vanadate ($SrVO_3$) having a perovskite structure has been theoretically predicted to have a low work function value of 1.79 eV which can be further reduced to 1.07 eV via barium oxide (BaO) surface impregnation, which is lower than those predicted for two commercial available/heavily researched electron emitters BaO+W (1.56 eV) and BaO+$Sc_2O_3$ (1.21 eV).

To date, thermionic emission surface studies of $SrVO_3$ have been hampered by the lack of good quality, large single crystals. The largest $SrVO_3$ crystals with reported dimensions to date closely resemble fibers with sizes on the order of 15-20 mm in length and 0.6 mm in diameter. Further, depending on the specific growth conditions, these fibers were found to have varying Sr to V stoichiometries and in extreme cases differing compositions were surmised to be close to $Sr_5V_4O_{13}$ or $Sr_6V_5O_{16}$. Given that surface work function values are both extremely composition and material dependent, a repeatable and controllable process for producing these materials is highly desirable.

Accordingly, there exists an ongoing and unmet need for improved metal oxides, such as, for example, $SrVO_3$ and crystal growth methods of making such metal oxides.

BRIEF DESCRIPTION OF THE FIGURES

For a fuller understanding of the nature and objects of the disclosure, reference should be made to the following detailed description taken in conjunction with the accompanying figures.

SUMMARY

Figure 1:
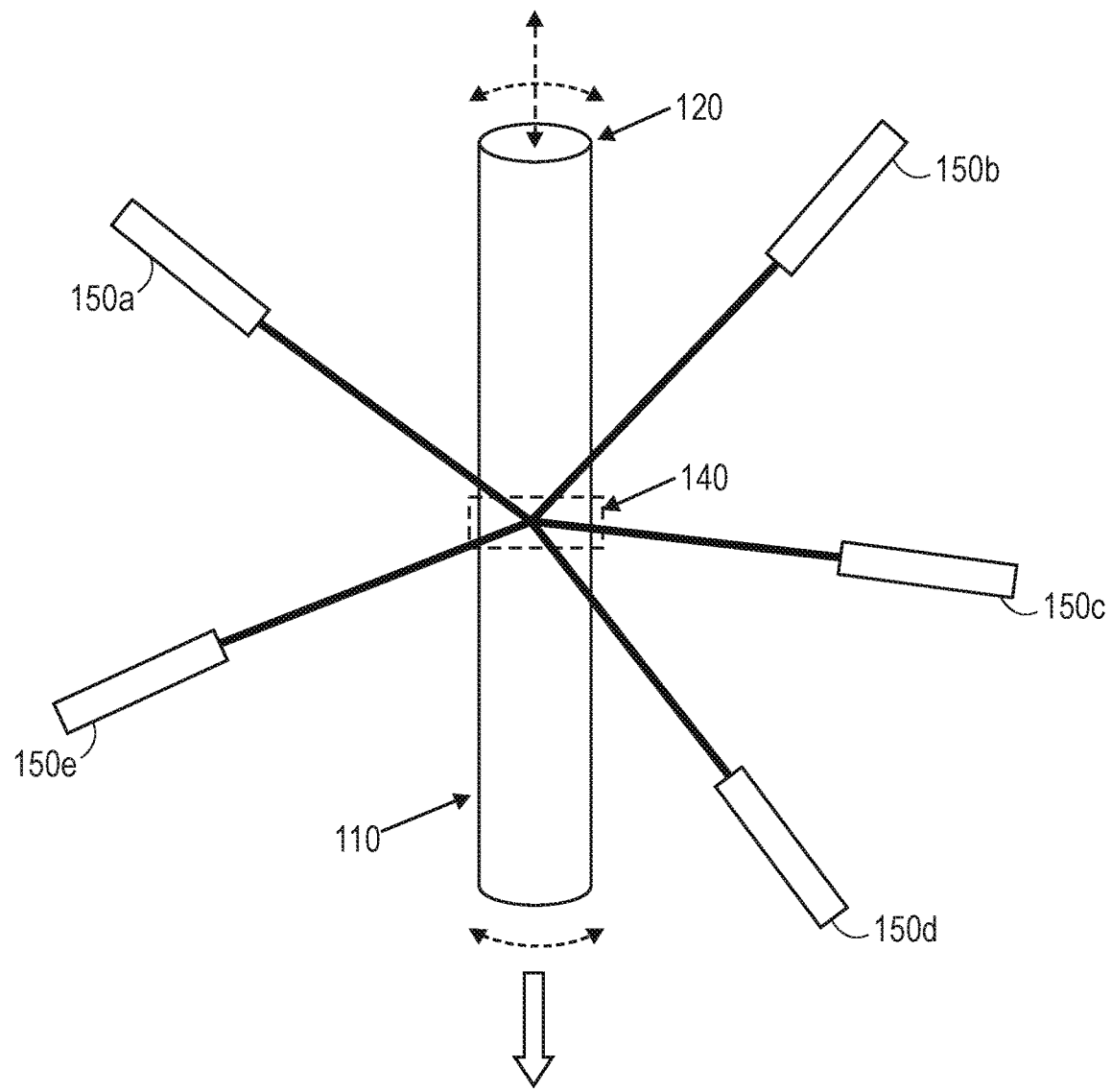
FIG. 1 schematically depicts a method for forming a metal oxide according to the present teachings.

According to the present teachings, a method for making a metal oxide material includes positioning a seed rod comprising an isostatically pressed metal oxide powder within a heating zone and heating an end of the seed rod to form a melt portion at the end of the seed rod. The method further includes contacting the melt portion of the seed rod with an end of a feed rod in the heating zone, wherein the feed rod comprises an isostatically pressed metal oxide powder, and wherein a metal oxide of the seed rod is the same as a metal oxide of the feed rod. The method further includes forming a molten zone comprising the melt portion of the end of the seed rod and a melt portion of the end of the feed rod and moving the seed rod and feed rod together through the heating zone at a translation rate that allows solidification of a portion of the molten zone to form a crystalline metal oxide and extension of the molten zone to a portion of the feed rod adjacent to the melt portion.

According to the present teachings, the crystalline metal oxide material can be one of a single crystal metal oxide and a polycrystalline metal oxide. The method can optionally include continuing to move the feed rod through the heating zone until all or substantially all of the feed rod forms a single crystal metal oxide or a polycrystalline metal oxide. Optionally, the feed rod can comprise a length of about 2 cm to about 20 cm and a diameter of about 1 mm to about 20 mm, and the seed rod and the feed rod can optionally comprise $AMO_3$ wherein A=Ca, Sr, Ba, or a combination thereof, M=V, Nb, Ta, Mo, or a combination thereof.

According to the present teachings, the method for making a metal oxide material can optionally include forming the seed, the feed rod, or both by heating a metal oxide precursor powder at a temperature from about 100° C. to 2000° C. in a reducing atmosphere; optionally, homogenizing the heated metal oxide precursor powder and heating the homogenized and heated a metal oxide precursor powder at temperature from about 100° C. to 2000° C. in a reducing atmosphere; repeating the homogenizing and heating of the homogenized and heated metal oxide precursor powder for a desired number of times to form the metal oxide powder; and isostatically pressing an amount of the metal oxide powder to form the seed, the feed rod, or both. The metal oxide precursor powder can optionally comprise $Sr_2V_2O_7$. The method for making a metal oxide material can also optionally include forming the metal oxide precursor powder by a method including heating a mixture of homogenized metal oxide precursor starting materials at a temperature from about 100° C. to 2000° C.; and optionally, rehomogenizing the heated mixture of metal oxide precursor starting materials and heating the rehomogenized and heated a metal oxide precursor powder at temperature from about 100° C. to 2000° C. for a desired number of times to form the metal oxide precursor powder at a desired level of purity. The method for making a metal oxide material can further optionally include determining a purity level of the metal oxide precursor powder by powder x-ray diffraction.

According to the present teachings, the method for making a metal oxide material can also optionally include moving the seed rod and feed rod together through the heating zone comprising moving the seed rod and the feed rod along a primary longitudinal axis of the feed rod with respect to the heating zone at a translation rate of about 0.1 mm/hr to about 300 mm/hr and/or rotating the seed rod, the feed rod, or both at rate of 0 to 100 rpm. The method for making a metal oxide material can further optionally include creating the heating zone by a laser diode floating zone furnace and/or heating the seed rod, the feed rod, or both subsequent to isostatically pressing the metal oxide powder to form the seed rod, the feed rod, or both and prior to positioning the seed rod, the feed rod, or both within the heating zone. In addition, the method for making a metal oxide material can optionally include heating the seed rod, the feed rod, or both a temperature of about 100° C. to about 1400° C. in one of a vacuum atmosphere or in a reducing atmosphere and/or a composition of the metal oxide powder ranges from 0 wt % $SrVO_3$:100 wt % $Sr_2V_2O_7$ to 100 wt % $SrVO_3$:0 wt % $Sr_2V_2O_7$.

According to the present teachings, a metal oxide rod includes a composition represented by $AMO_3$, wherein A=Ca, Sr, Ba, or combinations thereof and M=V, Nb, Ta, Mo, or combinations thereof, and a length ranging from about 2 cm to about 20 cm; and a diameter ranging from about 1 mm to about 10 mm, and wherein the metal oxide rod consists primarily of a single crystal structure.

According to the present teachings, the metal oxide rod can optionally have a composition that consists of $SrVO_3$ and/or include a vestigial remnant of a seed rod used to fabricate the metal oxide rod, wherein the vestigial remnant of a seed rod is disposed at an end of the metal oxide rod. The metal oxide rod can further optionally have a single crystal structure is free of secondary phase impurities and inclusions.

According to the present teachings, a thermionic emission device can include one or more metal oxide rods of claim 1 formed by the method of claim 1 and configured to emit electrons; a magnetic focusing lens configured to focus electrons emitted by the one or more metal oxides rods at a sample; and a detector configured to detect and image the electrons focused by the magnetic focusing lens subsequent to the electrons passing through the sample.

DETAILED DESCRIPTION OF THE DISCLOSURE

Although claimed subject matter will be described in terms of certain embodiments and examples, other embodiments and examples, including embodiments and examples that do not provide all of the benefits and features set forth herein, are also within the scope of this disclosure. Various structural, logical, and process step may be made without departing from the scope of the disclosure.

Ranges of values are disclosed herein. The ranges set out a lower limit value and an upper limit value. Unless otherwise stated, the ranges include all values to the magnitude of the smallest value (either lower limit value or upper limit value) and ranges between the values of the stated range.

The present disclosure provides methods of making single crystalline metal oxides or polycrystalline metal oxides in a manner that is scalable for production quantities. Use of the disclosed methods produces single crystalline metal oxides, such as $SrVO_3$, or polycrystalline metal oxides with dimensions, phase purity, and/or crystalline quality previously unachievable through conventional methods. These metal oxides may enable thermionic electron emitters in devices, such as, e-beam lithography and electronic microscopy.

In particular, the present disclosure provides a new, scalable process for the preparation of functional metal oxides, such as, for example, $AMO_3$, where A=Ca, Sr, Ba, or the like, or a combination thereof; and, M=V, Nb, Ta, Mo, or the like, or a combination thereof, in polycrystalline and single crystalline form. As disclosed herein, the method includes a combination of a gas atmosphere, vacuum sintering, and laser-based directional solidification that yields, for example, phase-pure polycrystals (free of secondary phase impurities) and inclusion-free single crystals of $SrVO_3$ of sufficient quality for thermionic emission use, and in a fashion scalable to production quantities. The disclosed methods include heating (e.g., incremental heating) of a polycrystalline seed rod and feed rod that do not include any binding agent(s) which can yield unwanted secondary phase(s). In various embodiments, the disclosed methods do not use any binding agent(s) and the metal oxides formed do not include any secondary phase(s).

As shown in FIG. 1, a method of making a single crystalline metal oxide or a polycrystalline metal oxide may comprise: heating in a heating zone 140, which may be referred to as a hot zone, a seed rod 110 (e.g., a first isostatically pressed metal rod), where a first melt portion is formed at an end of the rod, which may be the top of the rod; causing the first melt portion and a feed rod 120 (e.g., a second isostatically pressed metal rod) to be in contact with each other (e.g., wherein the first melt portion and at least a portion of the second rod (which may be the bottom portion of the feed rod (e.g., second isostatically pressed metal oxide rod)) forming a molten zone/floating zone), for a selected time and/or temperature (which may be formed by a selected laser power), moving (e.g., moving downward, as represented by the bolded arrow in FIG. 1) the first isostatically pressed metal oxide rod and the second isostatically pressed metal oxide rod with respect the heat source/the heating zone (e.g., at translation rates wherein at least a portion of the first isostatically pressed metal oxide rod moves out of and the at least a portion of the second isostatically pressed metal oxide rod moves into the heating zone) (the moving may be carried out continuously or in a stepwise manner until a desired amount of the single crystalline metal oxide or the polycrystalline metal oxide is formed)), where at least a portion of the first rod and, optionally, a portion of the second rod, decrease in temperature and form the single crystalline metal oxide or the polycrystalline metal oxide.

Figure 2:
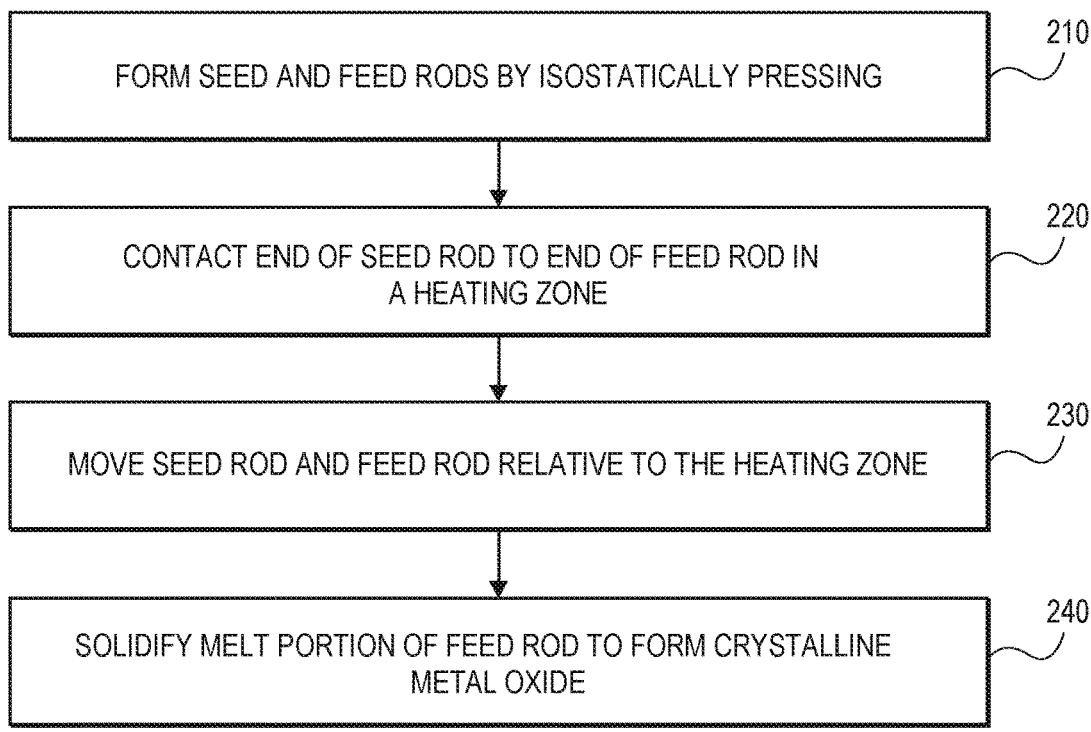
FIG. 2 is flowchart depicting a method for forming a single or crystalline metal oxide according to the present teachings.

According to the present disclosure, a method 200 for forming the single crystalline metal oxide or the polycrystalline metal oxide is provided and shown in FIG. 2. At 210 of method 200 a seed rod, for example seed rod 110 shown in FIG. 1, is formed by isostatically pressing a metal oxide powder. The seed rod (which may be referred to as an isostatically pressed metal oxide seed rod or isostatically pressed polycrystalline metal oxide seed rod) comprises a metal oxide, which may be single crystalline or polycrystalline. The seed rod has a primary longitudinal axis, represented by the dashed arrow in FIG. 1, and the metal oxide may be affixed along the primary longitudinal axis in a lower (e.g., terminal) position.

The seed rod 110 may have various sizes. In a non-limiting example, the seed rod has a size (e.g., a longest dimension, such as for example, a length along a longitudinal axis) including a length of about 2 cm to about 20 cm and a diameter of about 1 mm to about 20 mm. The seed rod can further have a length of about 4 cm to about 10 cm and/or a diameter of about 4 mm to about 10 mm.

A feed rod, for example feed rod 120 shown in FIG. 1, is also formed by isostatically pressing a metal oxide powder. The seed rod (which may be referred to as a second isostatically pressed metal oxide rod or an isostatically pressed metal oxide feed rod) comprises a metal oxide. The metal oxide may be the same metal oxide as that of the seed rod or a different metal oxide than that of the seed rod. The feed rod has a primary longitudinal axis similar to that of the seed rod.

The feed rod may have various sizes. In a non-limiting example, the feed rod has a size (e.g., a longest dimension, such as for example, a length along a longitudinal axis) including a length of about 2 cm to about 20 cm and a diameter of about 1 mm to about 20 mm. The feed rod can optionally have a length of about 4 cm to about 10 cm and/or a diameter of about 4 mm to about 10 mm.

At 220 of method 200, seed rod 110 and feed rod 120 are heated, so that an end of seed rod 110 or an end of feed rod 120, or both an end of seed rod 110 and feed rod 120 include a molten zone. Referring back to FIG. 1, once a molten zone is formed, one end of the seed rod is placed in contact with one end of the feed rod so that the molten zone is in contact with seed rod 110 and feed rod 120 such that the primary axis of the seed rod is aligned with the primary axis of the feed rod. The heating may be carried out in a heating zone, for example, heating zone 140 of FIG. 1, which may be a stable, hot zone. The stable, hot zone may be produced using lasers (e.g., the lasers of a laser diode floating zone furnace), for example a plurality of lasers 150a-e as shown in FIG. 1. For example, a laser diode floating zone furnace may be equipped with GaAs lasers (e.g., five 200 Watt GaAs lasers) may be used to create the stable hot zone. The heating may be carried out in a reducing atmosphere (e.g., in a $N_2/H_2$ or $Ar/H_2$ atmosphere, Ar atmosphere, vacuum, or the like, or a combination thereof). For example, the seed rod (e.g., the tip of the seed rod, which may be the first melt portion of the seed rod) and feed rod are brought into contact with each other in the heating zone for a selected time and/or temperature (which may be formed by a selected laser power).

Referring again to FIG. 1, the heating of the seed rod 110 may form a melt portion of the seed rod. The feed rod 120 is moved into the heating zone 140. For example, the seed rod 110 and feed rod 120 are brought into or caused to be in contact with each other for a selected time and/or temperature (which may be formed by a selected laser power of the lasers 150a-e of a laser diode floating zone furnace). The melt portion of the seed rod and feed rod may be in proximity (e.g., in contact) in the molten zone/floating zone, which may be formed by lasers 150a-e, operating at a desired power of the lasers.

At 230 of method 200, the seed rod 110 and feed rod 120 may be moved (e.g., translated) in relation to the heating zone 140 (e.g., through the heating zone) until substantially all or all of the feed rod has been in the heating zone and forms a single crystalline metal oxide or a polycrystalline metal oxide. As an illustrative example, where the seed rod and feed rod are oriented end to end, the seed rod and feed rod are moved (e.g., continuously moved) (e.g., relative to the heating zone) until substantially all or all of the feed rod) is consumed and a single crystalline or polycrystalline metal oxide is formed. The moving may commence after visually determining that stability of the seed and feed rod has been reached.

The heating zone, for example of a laser diode floating zone furnace, may be configured such that the seed and feed rod can be moved through the heating zone in a downward direction as represented by the bolded arrow in FIG. 1.

The seed rod and feed rod may be moved through the heating zone at various rates. The moving may be constant, variable, or intermittent (e.g., including a period or periods of no movement). The moving of the seed and feed rods may be synchronized. In a non-limiting example, the moving (e.g., downward translation rate of the seed and/or feed rods and/or the repeat moving of the seed and/or feed rods is carried out at rate of 0.1 mm/hr to 300 mm/hr (e.g., 10 mm/hr), including all values and ranges therebetween.

A portion of or all of the seed rod and/or feed rod may cool after moving out of the heating zone. For example, a portion of or all of the seed rod and/or feed rod decrease(s) in temperature as a result of moving (e.g., translating) the rods.

The seed and feed rods may be rotated as represented by the dotted arrows in FIG. 1. The seed and/or feed rods may be rotated during at least a portion of or all of the heating. The rotating may be constant, variable, or intermittent (e.g., include a period or periods or no rotation) and/or the seed rod and feed rod may be rotated in the same direction or different directions. The rotation of the seed and feed rods may be synchronized or not synchronized. In a non-limiting example, the seed rod and/or the feed rod) is/are rotated at rate of 1 to 100 rpm, including all rpm values and ranges therebetween.

At 240 of method 200, moving the seed rod and feed rod in relation to the heating zone results in formation of a single crystalline metal oxide or the polycrystalline metal oxide product rod. The product rod may be formed from at least a portion of the seed rod and substantially all or all of the feed rod. The product rod may be attached to at least a portion of (a vestigial remnant of) the seed rod.

The seed and/or feed rods may comprise or be formed from various metal oxide precursors (these metal oxides may be referred to as metal oxide precursor powders). The metal oxides precursor of the seed and/or feed rods may be single crystalline or polycrystalline. In various examples, a seed and/or a feed rod are formed from a metal oxide precursor having the following composition: $AMO_3$ (A=Ca, Sr, Ba, or the like, or a combination thereof; M=V, Nb, Ta, Mo, or the like, or a combination thereof). In non-limiting examples, the seed and/or feed rods comprise or are formed from $SrVO_3$. In various examples, the composition of the metal oxide precursor powder comprising seed rod 110 and feed rod 120 ranges from 0 wt % $SrVO_3$:100 wt % $Sr_2V_2O_7$ to 100 wt % $SrVO_3$:0 wt % $Sr_2V_2O_7$, including all wt. % values and ranges therebetween. The composition of the metal oxide precursor powder comprising seed rod 110 and feed rod 120 can further range from 85 wt % $SrVO_3$:15 wt % $Sr_2V_2O_7$ to 100 wt % $SrVO_3$:0 wt % $Sr_2V_2O_7$. In another example, the seed rod comprises or is single crystalline $SrVO_3$ and the feed rod comprises or is polycrystalline $SrVO_3$.

Figure 3:
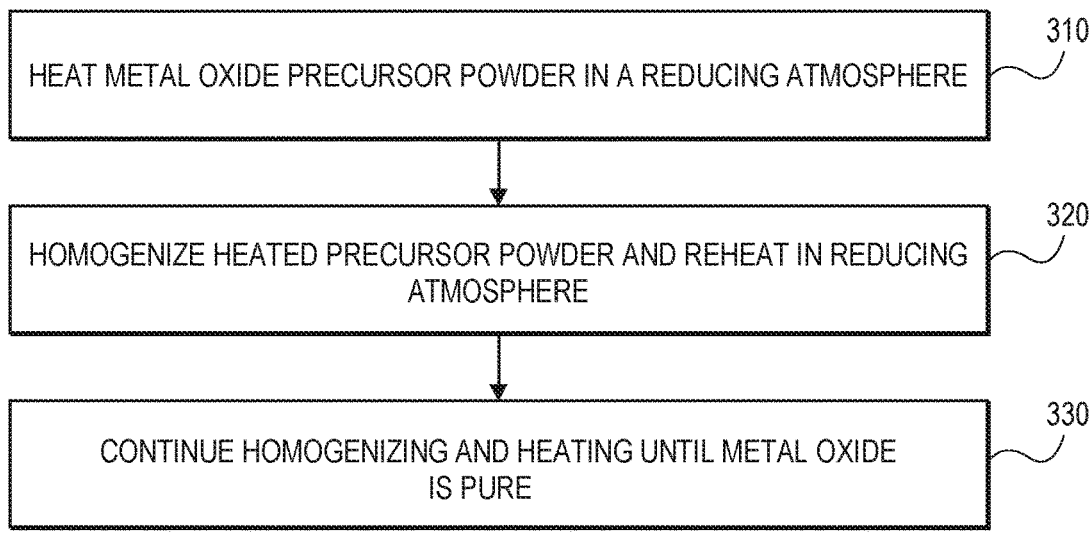
FIG. 3 is a flowchart depicting a method for forming a metal oxide powder according to the present teachings.

Various metal oxides and/or metal oxide precursors may be used to make the seed rod and/or feed rod. The metal oxide precursor may be a metal oxide precursor powder (e.g., pure phase metal oxide powder). FIG. 3 shows a method 300 for making the metal oxide precursor powders according to the present teachings. At 310 of method 300, a metal oxide precursor powder is formed by heating (e.g., heating in a tube furnace) a metal oxide precursor powder at a temperature of 100° C. to 2000° C. (e.g., 1000° C.), including all values and ranges therebetween, in a reducing atmosphere (e.g., in a N$_2$/H$_2$ or Ar/H$_2$ atmosphere);. At 320 of method 300 the heated metal oxide precursor powder can optionally be homogenized (e.g., rehomogenizing). Heating (e.g., reheating) the homogenized and heated metal oxide precursor can be done at a temperature of 100° C. to 2000° C. (e.g., 1000° C.), including all values and ranges therebetween, in a reducing atmosphere (e.g., in a N$_2$/H$_2$ or Ar/H$_2$ atmosphere, Ar atmosphere, vacuum, or the like, or a combination thereof). At 330 of method 300, rehomogenizing the homogenized and heated metal oxide precursor and heating (e.g., heating in a tube furnace) the rehomogenized metal oxide precursor at a temperature of 100° C. to 2000° C. (e.g., 1000° C.), including all values and ranges therebetween, in a reducing atmosphere (e.g., in a N$_2$/H$_2$ or Ar/H$_2$ atmosphere, Ar atmosphere, vacuum, or the like, or a combination thereof) can be performed a desired number of times, until the metal oxide precursor (e.g., a pure phase metal oxide precursor) is formed (e.g., as determined by powder x-ray diffraction).

Various metal oxide precursor powders may be used. It is within the purview of one skilled in the art to select metal oxide precursor starting material in order to form a desired metal oxide precursor powder. The metal oxide precursor starting material may be metal oxides (e.g., V$_2$O$_5$,), metal carbonates (e.g., SrCO$_3$), or a combination thereof. The metal oxide precursors may have one or more impurities.

In non-limiting examples, the metal oxide precursor powder is Sr$_2$V$_2$O$_7$ powder.

Figure 4:
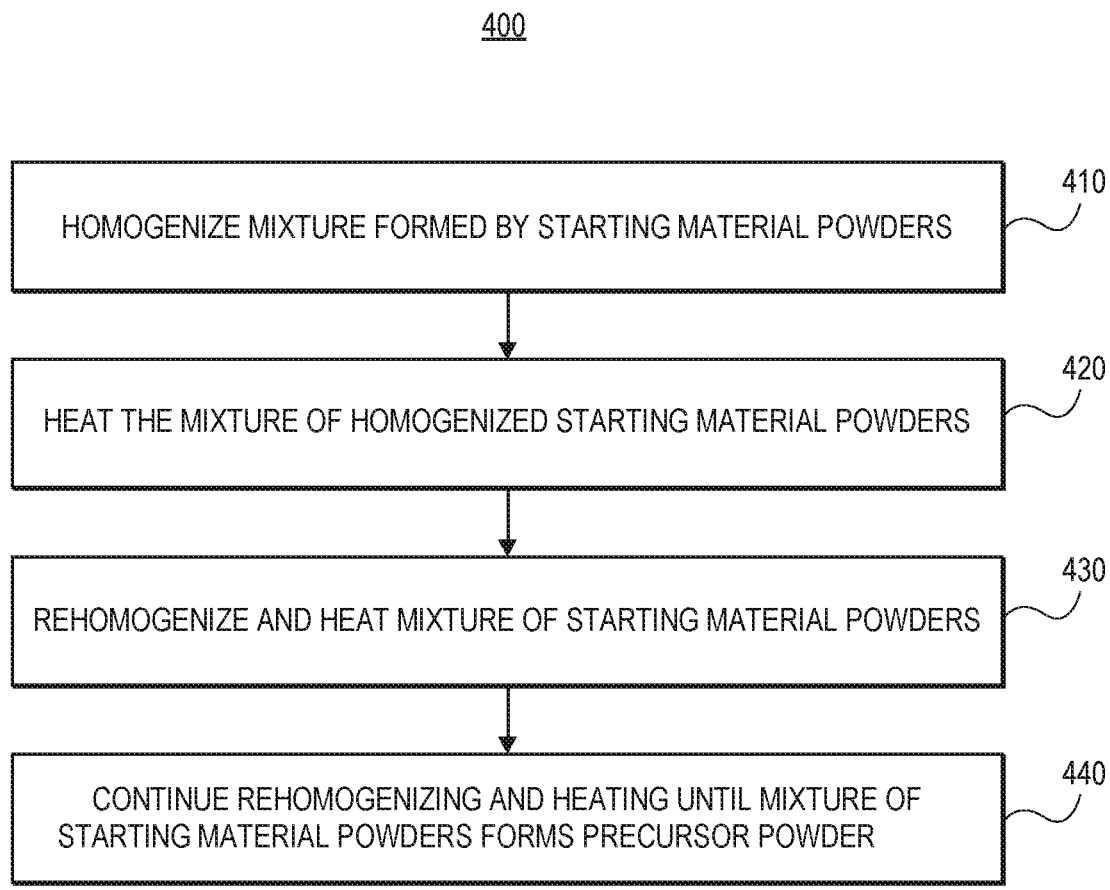
FIG. 4 is a flowchart depicting a method for forming a precursor used to form the metal oxide powder according to the present teachings.

In various examples, the metal oxide precursor powder is formed by a method 400 shown in FIG. 4. At 410 of method 400, precursor starting material powders can be homogenized and then heated at 420 of method 400 in a tube or box furnace at a temperature of about 100° C. to about 2000° C. (e.g., 1000° C.), including all values and ranges therebetween an oxidizing atmosphere (e.g., air, O$_2$, or the like, or a combination thereof). At 430 of method 400 can include rehomogenizing the precursor starting material powders and heating in air at a temperature of 100 to 2000° C. (e.g., 1000° C.), including all values and ranges therebetween, iteratively in a tube or box furnace. At 440 of method 400, rehomoginization and heating can continue until the metal oxide precursor powder is formed at a purity level as desired, for example, about 100 wt %, as determined by powder x-ray diffraction.

In various other examples, the metal oxide precursor powder (e.g., pure metal oxide precursor), which has one or more metal with an oxidation state greater than that same metal in the metal oxide powder (e.g., SrVO$_3$), is formed by a method comprising heating (e.g., heating in a tube furnace or box furnace) a mixture of metal oxide precursors starting materials (e.g., homogenized metal precursor starting materials at a temperature of 100 to 2000° C. (e.g., 1000° C.), including all values and ranges therebetween, (e.g., in air); and optionally, rehomogenizing the heated mixture of metal oxide precursors and heating (e.g., in a box furnace) the rehomogenized heated mixture of metal oxide precursor starting materials at a temperature of 100 to 2000° C. (e.g., 1000° C.), including all values and ranges therebetween, (e.g., in air); and optionally, rehomogenizing the rehomogenized and heated mixture of metal oxide precursor starting materials and heating (e.g., in a box furnace) the twice rehomogenized and heated mixture of metal oxide precursors at a temperature of 100 to 2000° C. (e.g., 1000° C.), including all values and ranges therebetween, (e.g., in air) a desired number of times (e.g., until the metal oxide precursor powder is formed at a purity level as desired, for example a purity level of 100 wt % (e.g., as determined by powder x-ray diffraction), where the metal oxide precursor (e.g., pure metal oxide precursor) is formed (e.g., as determined by powder x-ray diffraction).

The seed and/or feed rod may be formed by various methods. The methods are based on isostatic pressing and heating of the isostatically pressed rod. In various examples, the seed rod and/or the feed rod) are formed by isostatic/isostatically pressing (e.g., isostatic/isostatically pressing a metal oxide powder, which may be a pure phase metal oxide powder) to form a rod; and heating, optionally, in a vacuum, the isostatically formed (e.g., isostatically pressed) rods.

The heating may be carried out at various temperatures. In various examples, the heating is carried out at a temperature of 100 to 1400° C. (e.g., 1200° C.), including all values and ranges therebetween, or about 1400° C. in a vacuum (e.g., a dynamic vacuum) atmosphere (e.g., a pressure of $1 \times 10^{-5}$ torr or less or about $10^{-5}$ to $10^{-6}$ torr. Without intending to be bound by any particular theory it is considered that that the heating results in densification of the rod.

The single crystalline metal oxide or polycrystalline metal oxide can be various single crystalline or polycrystalline metal oxides. In various non-limiting examples, a single crystalline or a polycrystalline metal oxide has the following composition: AMO$_3$ (A=Ca, Sr, Ba, or the like, or a combination thereof; M=V, Nb, Ta, Mo, or the like, or a combination thereof. In a non-limiting example, the single crystalline metal oxide or polycrystalline metal oxide comprises SrVO$_3$.

In an aspect, the present disclosure provides single crystalline metal oxides or polycrystalline metal oxides and method for making them. A single crystalline metal oxide or polycrystalline metal oxide may have one or more desirable properties including but not limited to impurities/impurity amounts, magnetism, heat capacity, and the like, and combinations thereof. In various examples, the single crystalline metal oxide or polycrystalline metal oxide is made by a method of the present disclosure. A single crystalline metal oxide may be an inclusion-free single crystal. A polycrystalline metal oxide may be a phase-pure polycrystal. The single crystalline metal oxide or polycrystalline metal oxide can be of various shapes and/or sizes. For example, the single crystalline metal oxide or polycrystalline metal oxide is in the form of a rod or the like. The following example is presented to illustrate the present disclosure. It is not intended to be limiting in any matter.

EXAMPLE

An exemplary method to form single crystalline and polycrystalline metal oxides as disclosed herein is provided. The exemplary method is an efficient and reproducible process that can be utilized to produce high quality SrVO$_3$ single crystals, and similar materials, that have a desirable size. A detailed description of the exemplary method is described in the following.

Polycrystalline SrVO$_3$ was synthesized by first preparing Sr$_2$V$_2$O$_7$, where thoroughly mixed batches of dried SrCO$_3$ and V$_2$O$_5$ (2:1 molar ratio) were heated to 600° C. for 24 hours in a box furnace. Subsequent regrinds and reheatings (1000° C. for 12 hours in a box furnace) were performed until it was observed via X-ray powder diffraction that only the Sr$_2$V$_2$O$_7$ phase was present. Following this, Sr$_2$V$_2$O$_7$ was heated at 1000° C. in a three-zone tube furnace under a flowing Ar:H$_2$ (95%:5%) gas mixture to form SrVO$_3$ via reduction of the starting material. Again, subsequent regrinds and reheatings under flowing Ar:H$_2$ were performed until it was observed via X-ray powder diffraction that only the SrVO$_3$ phase was present.

Prior to preparing single crystals of SrVO$_3$ using the floating zone procedure, sintered rods were constructed by compacting and isostatically pressing the SrVO$_3$ powder into the form of cylindrical rods. These rods were heated to 1200° C. in a vacuum furnace (Materials Research Furnaces, Inc., F-3×6-W/W/M-1700-VT-G-CP-BR-HMI) for 8 hours using a 10$^{-5}$ torr dynamic vacuum atmosphere. Once sintered, the seed and feed rods were attached to the lower and upper shafts of a laser diode floating zone furnace (Crystal Systems, Inc., LD-FZ-5-200W-VPO-PC) equipped with five 200 Watt GaAs lasers. At the beginning of the growth the seed was melted first, and the molten zone was formed by bringing the feed into contact with a melted seed portion. During the growth, the seed and feed rods were counter rotated at 10 rpm, and the crystal was formed by moving the seed and feed rod downward (molten zone fixed) at rates of 7 and 5 mm/hour, respectively. In order to maintain the reduced V$^{4+}$ oxidation state of SrVO$_3$, all growths were performed using 1 atmosphere of the Ar:H$_2$ gas mixture described above with a flow rate of 1 L/minute.

Figure 5:
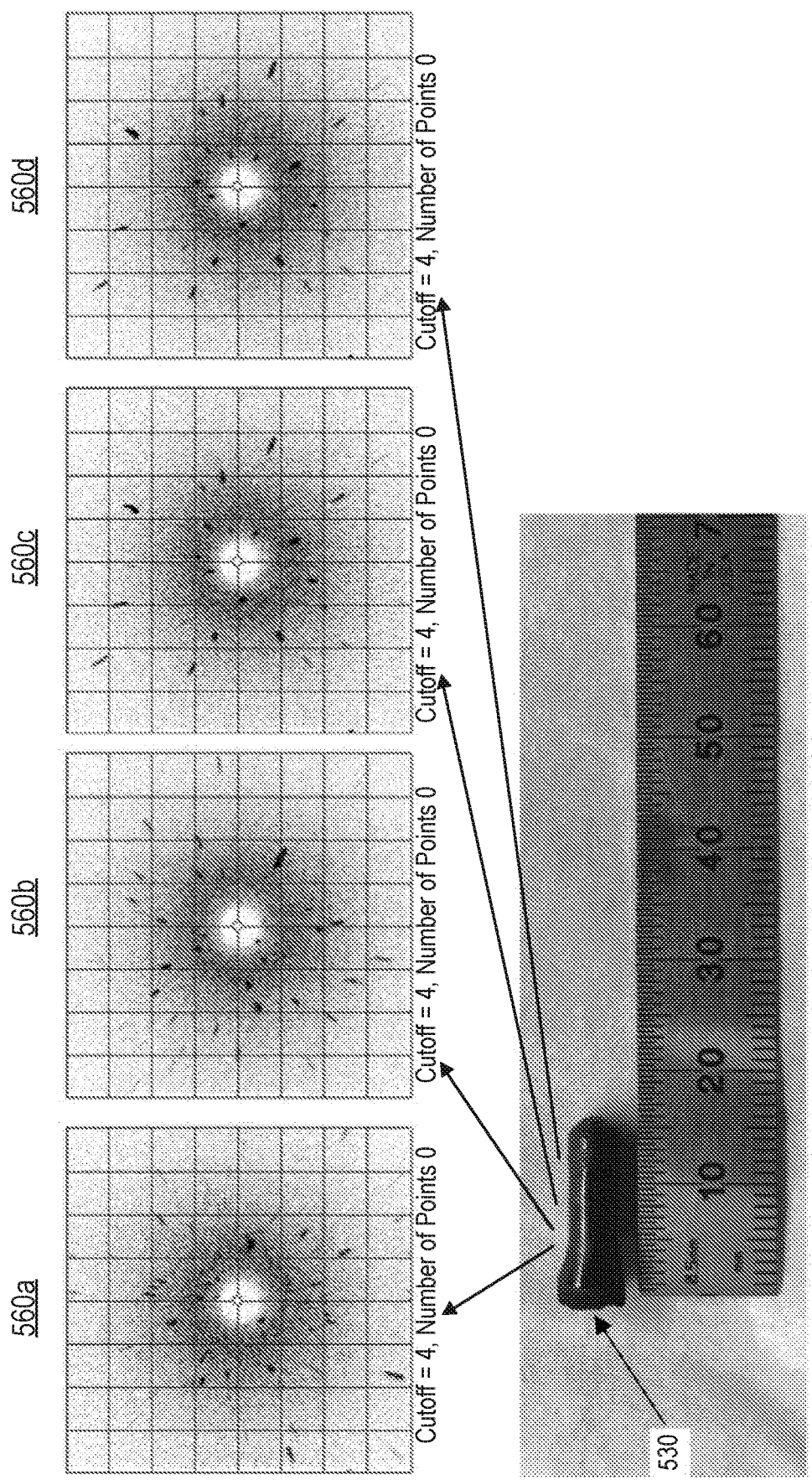
FIG. 5 shows a single crystal of $SrVO_3$ formed according to the disclosed method and Laue images along a length of the single crystal of $SrVO_3$ demonstrating the single crystal nature of the metal oxide rod formed according to the present teachings.

FIG. 5 shows a single crystal of SrVO$_3$ 530 produced using the above described process along with Laue photos 560a, 560b, 560c, and 560d highlighting the single crystal nature along a length of single crystal of SrVO$_3$ 530.

Figure 6:
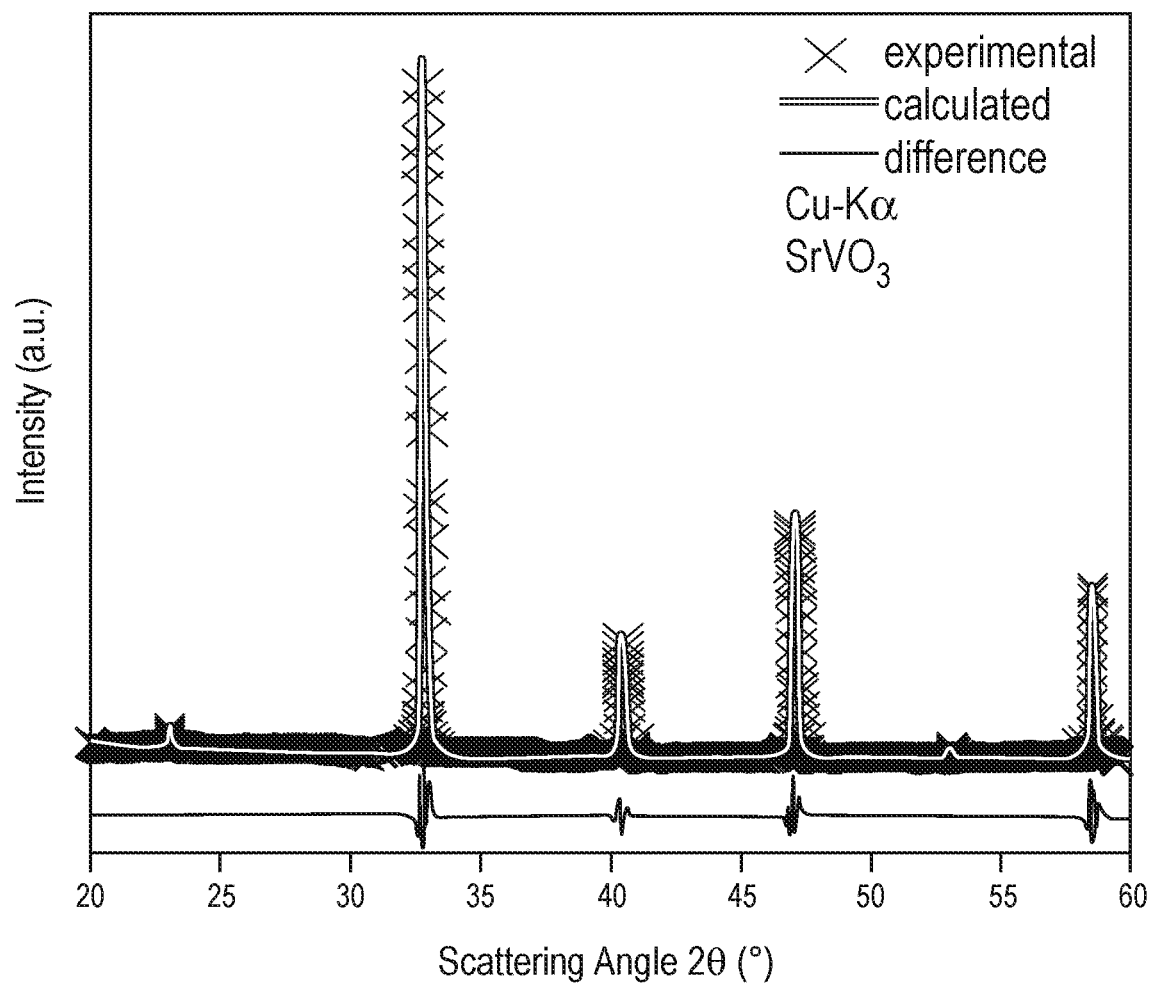
FIG. 6 shows a Rietveld refinement to powder X-ray diffraction data of a pulverized example of single crystal of $SrVO_3$ formed according to the present teachings.

FIG. 6 shows Rietveld refinement models to powder X-ray diffraction data of a pulverized SrVO$_3$ single crystal 530 highlighting the overall purity. The graph shows that the calculated perovskite SrVO$_3$ model (white line outlined in black) nicely reproduces the data (crosses) with minimal differences between model and data as evidenced by the difference curve (lower black line). This shows that the prepared single crystals are perovskite SrVO$_3$.

Previously reported techniques use SrCO$_3$ and V$_2$O$_5$ as starting materials and utilize a binding agent to help sinter the rods. Those conventional method can provide various secondary phases that are thermodynamically stable. The coexistence of secondary impurities, such as, for example, Sr$_3$V$_2$O$_7$, Sr$_4$V$_3$O$_{10}$, Sr$_5$V$_4$O$_{13}$ and Sr$_6$V$_5$O$_{16}$ have been a consistent problem in the single crystal growth of SrVO$_3$. Further, the use of a binding agent can introduce void defects that affect the density and homogeneity of a crystal. These impurities constitute defects and are not suitable for thermionic emitting materials due to several intrinsic factors. Rods with 85 wt % SrVO$_3$ and 15 wt % of the thermodynamically stable intermediate Sr$_2$V$_2$O$_7$ were made. The use of forming gas (95% Ar-5% H$_2$) in the disclosed method allowed for the reduction of Sr$_2$V$_2$O$_7$ to SrVO$_3$ and resulted in a dense, single domain, and highly pure SrVO$_3$ single crystal. Therefore, the disclosed method conclusively and reproducibly ensures the successful growth of large single crystals of SrVO$_3$ without secondary phase impurities using a range of metal oxide precursors and without the need for binding agents.

Figure 7:
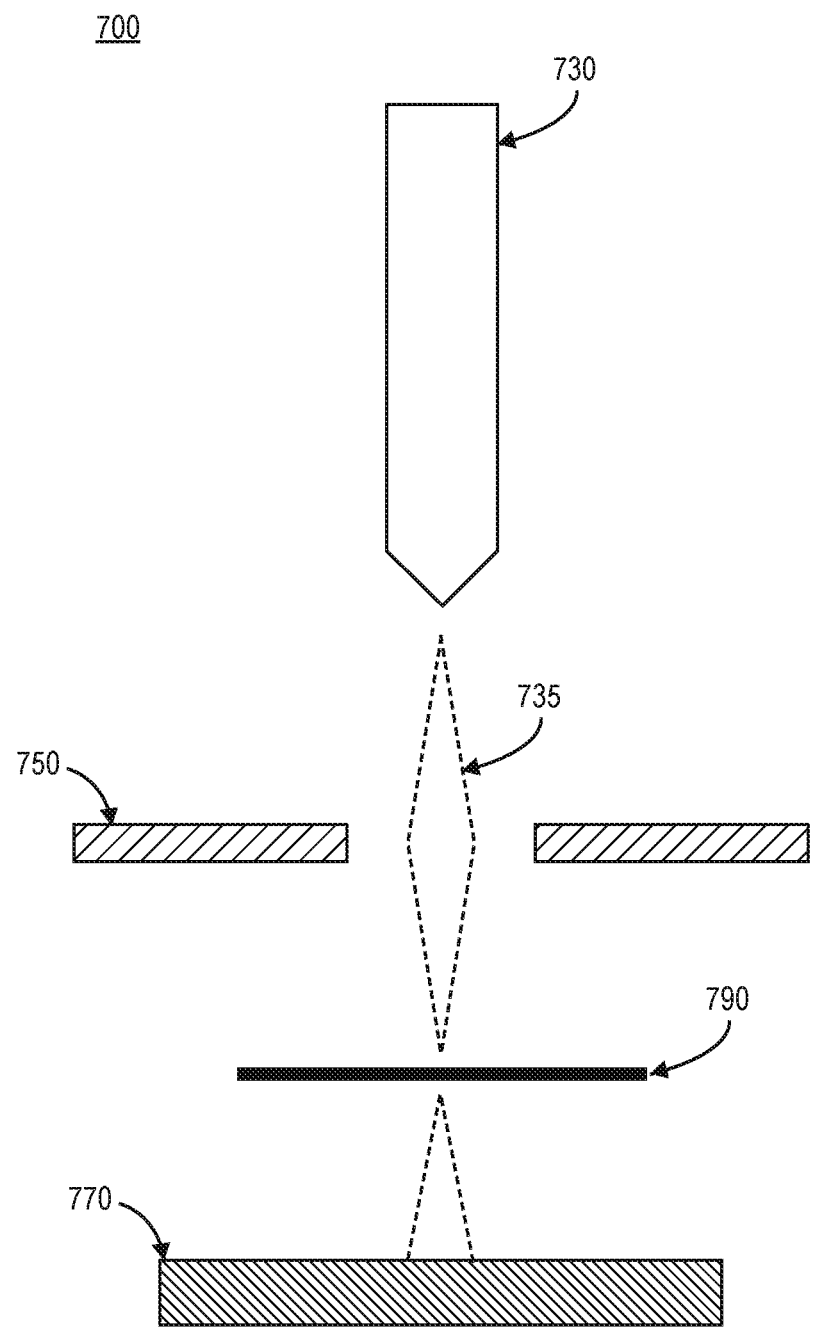
FIG. 7 schematically depicts a thermionic emission device including one or more single crystalline and/or polycrystalline metal oxides formed according to the present teachings.

In an aspect, the present disclosure provides devices comprising one or more single crystalline metal oxides and/or one or more polycrystalline metal oxides as disclosed herein. The device may be a thermionic emission device or the like. The thermionic emission device may be a transmission electron microscopy (TEM) gun. FIG. 7 schematically depicts a transmission electron microscopy (TEM) gun 700 that includes one or more single crystalline or polycrystalline metal oxide 730 as disclosed herein. TEM gun 700 further includes a magnetic focusing lens 750 and a detector 770. In use, the one or more single crystalline or polycrystalline metal oxide 730 can emit an electron beam 735 that is focused by magnetic focusing lens 750 onto a sample 790. Detector 770 detects the electrons after passing through sample 790.

Although the present disclosure has been described with respect to one or more particular embodiments and/or examples, it will be understood that other embodiments and/or examples of the present disclosure may be made without departing from the scope of the present disclosure (e.g., oxygen defect contents in SrVO$_3$ that may result from reduction processes).

While the present teachings have been illustrated with respect to one or more implementations, alterations and/or modifications can be made to the illustrated examples without departing from the spirit and scope of the appended claims. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

We claim:

1. A method of making a metal oxide material comprising positioning a seed rod comprising an isostatically pressed metal oxide powder within a heating zone;

heating an end of the seed rod to form a melt portion at the end of the seed rod;

contacting the melt portion of the seed rod with an end of a feed rod in the heating zone, wherein the feed rod comprises an isostatically pressed metal oxide powder, and wherein a metal oxide of the seed rod is the same as a metal oxide of the feed rod;

forming a molten zone comprising the melt portion of the end of the seed rod and a melt portion of the end of the feed rod; and moving the seed rod and feed rod together through the heating zone at a translation rate that allows solidification of a portion of the molten zone to form a single crystalline metal oxide capable of thermionic emission and extension of the molten zone to a portion of the feed rod adjacent to the melt portion;
wherein the heating zone comprises a forming gas mixture of argon: hydrogen in a ratio of 95%:5%; and
wherein the seed rod and the feed rod comprise $AMO_3$, wherein A is Ca, Sr, Ba, or a combination thereof, and M is V, Nb, Ta, Mo, or a combination thereof.

2. The method of claim 1, wherein the crystalline metal oxide further comprises a single crystal metal oxide and a poly crystalline metal oxide.

3. The method of claim 2, further comprising continuing to move the feed rod through the heating zone until all or substantially all of the feed rod forms a single crystal metal oxide or a poly crystalline metal oxide.

4. The method of claim 1, wherein the feed rod comprises a length of about 2 cm to about 20 cm and a diameter of about 1 mm to about 20 mm.

5. The method of claim 1, further comprising forming the seed, the feed rod, or both by:
heating a metal oxide precursor powder at a temperature from about 100° C. to 2000° C. in a reducing atmosphere;
optionally, homogenizing the heated metal oxide precursor powder and heating the homogenized and heated a metal oxide precursor powder at temperature from about 100° C. to 2000° C. in a reducing atmosphere;
repeating the homogenizing and heating of the homogenized and heated metal oxide precursor powder for a desired number of times to form the metal oxide powder; and
isostatically pressing an amount of the metal oxide powder to form the seed, the feed rod, or both.

6. The method of claim 5, wherein the metal oxide precursor powder further comprises $Sr_2V_2O_2$.

7. The method of claim 5, wherein the metal oxide precursor powder is formed by a method comprising:
heating a mixture of homogenized metal oxide precursor starting materials at a temperature from about 100° C. to 2000° C.; and
optionally, rehomogenizing the heated mixture of metal oxide precursor starting materials and heating the rehomogenized and heated metal oxide precursor powder at temperature from about 100° C. to 2000° C. for a desired number of times to form the metal oxide precursor powder comprising a level of purity as desired.

8. The method of claim 7, further comprising determining the purity level of the metal oxide precursor powder by powder x-ray diffraction.

9. The method of claim 1, wherein moving the seed rod and feed rod together through the heating zone comprises moving the seed rod and the feed rod along a primary longitudinal axis of the feed rod with respect to the heating zone at a translation rate of about 0.1 mm/hr to about 300 mm/hr.

10. The method of claim 1, wherein the seed rod, the feed rod, or both are rotated at rate of 0 to 100 rpm.

11. The method of claim 1, wherein the heating zone is created by a laser diode floating zone furnace.

12. The method of claim 1, further comprising heating the seed rod, the feed rod, or both subsequent to isostatically pressing the metal oxide powder to form the seed rod, the feed rod, or both and prior to positioning the seed rod, the feed rod, or both within the heating zone.

13. The method of claim 12, wherein heating the seed rod, the feed rod, or both is carried out at a temperature of about 100 to about 1400° C. in a vacuum atmosphere or in a reducing atmosphere.

14. The method of claim 1, wherein a composition of the metal oxide powder comprises $SrVO_3$ and $Sr_2V_2O_7$.

15. A method of making a metal oxide material comprising
positioning a seed rod comprising an isostatically pressed metal oxide powder within a heating zone;
heating an end of the seed rod to form a melt portion at the end of the seed rod;
contacting the melt portion of the seed rod with an end of a feed rod in the heating zone, wherein the feed rod comprises an isostatically pressed metal oxide powder, and wherein a metal oxide of the seed rod is the same as a metal oxide of the feed rod;
forming a molten zone comprising the melt portion of the end of the seed rod and a melt portion of the end of the feed rod; and
moving the seed rod and feed rod together through the heating zone at a translation rate that allows solidification of a portion of the molten zone to form a single crystalline metal oxide capable of thermionic emission and extension of the molten zone to a portion of the feed rod adjacent to the melt portion; and wherein:
the seed rod or the feed rod comprise $Sr_2V_2O_7$ and $SrVO_3$.

16. The method of claim 15, wherein a composition of the isostatically pressed metal oxide powder comprises $SrVO_3$ and $Sr_2V_2O_7$ in a ratio of 85 wt % $SrVO_3$: 15 wt % $Sr_2V_2O_7$.

* * * * *